(12) United States Patent
Perkins et al.

(10) Patent No.: US 9,888,561 B2
(45) Date of Patent: Feb. 6, 2018

(54) PACKAGED ELECTRICAL COMPONENTS WITH SUPPLEMENTAL CONDUCTIVE STRUCTURES

(71) Applicant: Apple Inc., Cupertino, CA (US)

(72) Inventors: Ryan C. Perkins, Sunnyvale, CA (US); Trevor J. Ness, Palo Alto, CA (US); Tyler S. Bushnell, Mountain View, CA (US); Steven P. Cardinali, Campbell, CA (US)

(73) Assignee: Apple Inc., Cupertino, CA (US)

( * ) Notice: Subject to any disclaimer, the term of this patent is extended or adjusted under 35 U.S.C. 154(b) by 187 days.

(21) Appl. No.: 14/804,486

(22) Filed: Jul. 21, 2015

(65) Prior Publication Data

US 2017/0027058 A1    Jan. 26, 2017

(51) Int. Cl.
*H05K 1/16* (2006.01)
*H05K 1/02* (2006.01)
*H01L 23/60* (2006.01)
*H05K 1/18* (2006.01)
*H05K 7/00* (2006.01)
(Continued)

(52) U.S. Cl.
CPC .......... *H05K 1/0218* (2013.01); *H01L 23/60* (2013.01); *H01L 23/28* (2013.01); *H01L 23/564* (2013.01); *H01L 31/048* (2013.01); *H05K 1/147* (2013.01); *H05K 1/167* (2013.01); *H05K 1/185* (2013.01); *H05K 3/284* (2013.01); *H05K 9/0022* (2013.01); *H05K 2201/0133* (2013.01); *H05K 2201/0707* (2013.01); *H05K 2201/10098* (2013.01); *H05K 2201/10151* (2013.01); *H05K 2201/10371* (2013.01); *H05K 2201/10977* (2013.01); *H05K 2203/1316* (2013.01)

(58) Field of Classification Search
CPC ................... H05K 1/185; H05K 3/284; H05K 2201/10977; H05K 2201/0707; H05K 2201/10371; H05K 9/0022; H05K 9/0024; H05K 9/0081; H01L 23/28; H01L 23/564; H01L 21/56; H01L 31/0203; H01L 31/048; H01L 33/52
USPC ....... 361/748, 752, 757, 760, 764, 765, 782, 361/783, 816, 818; 174/251; 257/787–793; 14/748, 752, 757, 760, 14/764, 765, 782, 783, 816, 818
See application file for complete search history.

(56) References Cited

U.S. PATENT DOCUMENTS 8,847,372 B1    9/2014 Darvaeux et al.
8,946,879 B2    2/2015 Goida
(Continued)

*Primary Examiner* — Binh Tran
(74) *Attorney, Agent, or Firm* — Treyz Law Group, P.C.; G. Victor Treyz; David K. Cole

(57) ABSTRACT

Electrical components such as integrated circuits and other components may be mounted on a substrate such as a printed circuit substrate. A molded plastic cap may cover the components and a portion of the printed circuit substrate to form a packaged electrical device. Metal structures such as springs, posts, and other metal members may be insert molded within the plastic cap. A metal layer on the surface of the cap may be patterned to from electromagnetic shielding, signal paths, contact pads, sensor electrodes, antennas, and other structures. Multiple substrates each with a respective set of mounted electrical components may be joined using a flexible printed circuit. The flexible printed circuit may be covered with a rigid cap portion or an elastomeric material or may be left uncovered.

21 Claims, 23 Drawing Sheets

(51) Int. Cl.

*H05K 9/00* (2006.01)
*H01L 31/048* (2014.01)
*H01L 23/00* (2006.01)
*H01L 23/28* (2006.01)
*H05K 1/14* (2006.01)
*H05K 3/28* (2006.01)

(56) References Cited

U.S. PATENT DOCUMENTS

| | | |
|---|---|---|
| 9,030,000 B2 | 5/2015 | Eu et al. |
| 9,105,620 B1 | 8/2015 | Do et al. |
| 2008/0265395 A1* | 10/2008 | Hasegawa ............ H01L 23/043 257/690 |
| 2009/0215287 A1* | 8/2009 | Mori ..................... H05K 1/144 439/74 |
| 2010/0164089 A1 | 7/2010 | Felten |
| 2012/0098138 A1* | 4/2012 | Oka ....................... H01L 21/56 257/773 |

* cited by examiner

PACKAGED ELECTRICAL COMPONENTS WITH SUPPLEMENTAL CONDUCTIVE STRUCTURES

BACKGROUND

This relates generally to electronic devices, and, more particularly, to packaging for circuitry in electronic devices.

Electronic devices often include integrated circuits and other components that are mounted within semiconductor packages. System-in-package devices may contain multiple integrated circuits mounted together a single package. Use of this type of packaged device may be desirable in applications where space is at a premium.

In compact devices, it can be challenging to mount components efficiently. Signal routing paths and mounting structures can consume more space than desired and package layouts are often not sufficiently efficient to accommodate complex housing geometries. In view of these challenges, it would be desirable to be able to provide improved packaging for electronic components in electronic devices.

SUMMARY

Electrical components such as integrated circuits and other components may be mounted on a substrate such as a printed circuit substrate. A molded plastic cap may cover the components and a portion of the printed circuit substrate to form a packaged electrical device.

Metal structures such as springs, posts, and other metal members may be insert molded within the plastic cap. When installed within an electronic device, the metal structures may contact external components to make electrical contact with these external components.

A metal layer on the surface of the cap may be patterned to from electromagnetic shielding, signal paths, contact pads, sensor electrodes, antennas, and other structures. Electrical components can be soldered to the metal layer or may form electrical contact with the metal layer using springs or other coupling arrangements.

Multiple substrates each with a respective set of mounted electrical components may be joined using a flexible printed circuit. The flexible printed circuit may be covered with a rigid cap portion or an elastomeric material or may be left uncovered. The substrates may be angled at a non-zero angle with respect to each other, may be oriented at right angles with respect to each other, or may be parallel to each other.

DETAILED DESCRIPTION

Figure 1:
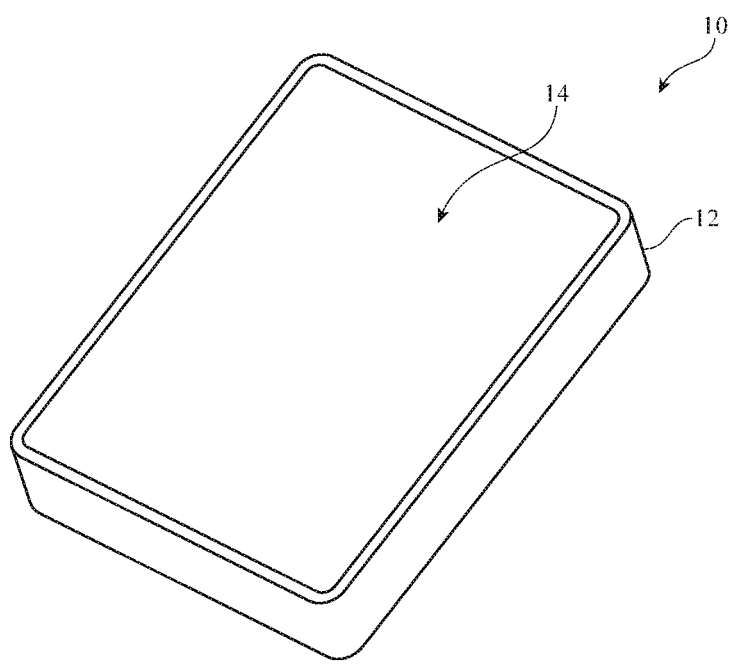
FIG. 1 is a perspective view of an illustrative electronic device that may include packaged circuitry in accordance with an embodiment.

An illustrative electronic device of the type that may be provided with integrated circuits and other packaged electrical devices is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
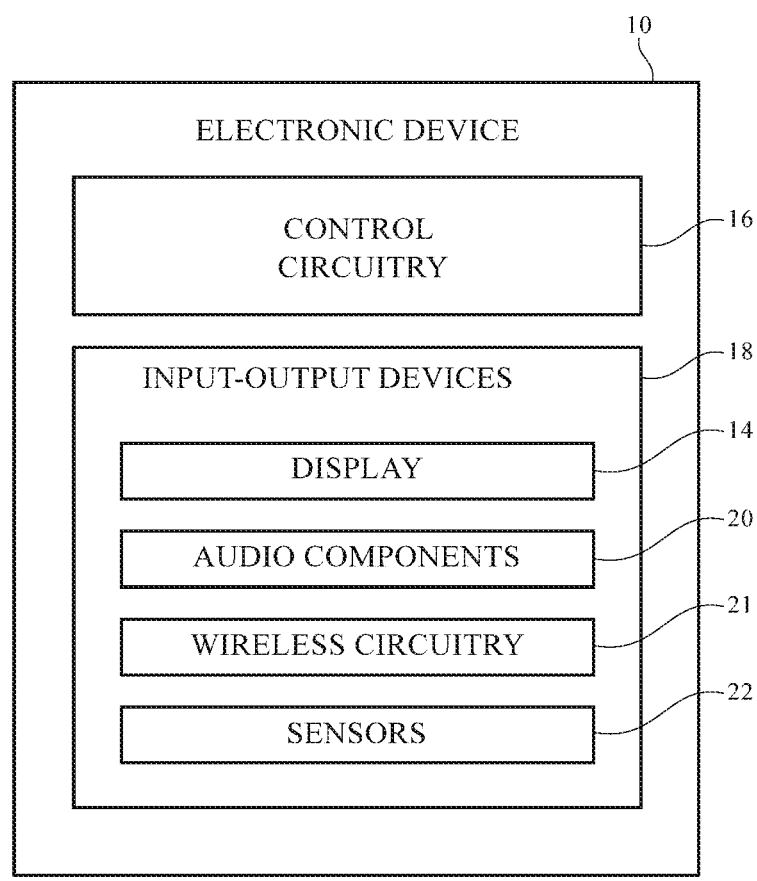
FIG. 2 is a schematic diagram of an illustrative electronic device that may include packaged circuitry in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include display 14, buttons, joysticks, scrolling wheels, touch pads, key pads, keyboards, audio components 20 such as microphones and speakers, tone generators, vibrators, cameras, sensors 22, light-emitting diodes and other status indicators, data ports, etc. Wireless circuitry 21 may be used to transmit and receive radio-frequency wireless signals. Wireless circuitry 21 may include antennas and radio-frequency transmitters and receivers operating in wireless local area network bands, cellular telephone bands, and other wireless communications bands.

A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14. The software of device 10 may also be used in controlling wireless transmission and reception of communications signals, sensor data gathering and processing operations, input-output device operation, and other device operations.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3A:
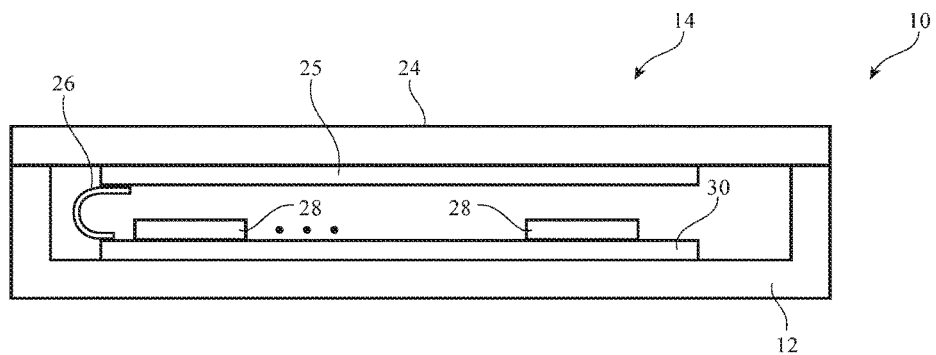
FIG. 3A is a cross-sectional side view of an illustrative electronic device that may include packaged circuitry in accordance with an embodiment.

A cross-sectional side view of an illustrative electronic device of the type that may include packaged integrated circuits and other packaged electrical devices is shown in FIG. 3A. As shown in FIG. 3A, device 10 may include a housing such as housing 12 in which display 14 is mounted. Display 14 may have a transparent cover layer such as display cover layer 24. Display layers 25 (e.g., liquid crystal display layers, organic light-emitting diode display layers, etc.) may be mounted below display cover layer 24. Packaged electrical devices 28 may be mounted in the interior of device 10 on one or more substrates such as substrate 30. Substrate 30 may be, for example, a printed circuit (e.g., a rigid printed circuit having a substrate formed from a rigid printed circuit board material such as fiberglass-filled epoxy or a flexible printed circuit formed from a flexible polymer substrate such as a sheet of polyimide). Signal path structures such as signal path structure 26 may be used to couple circuitry on substrates such as substrate 30 to other substrates and to components such as display 14 (e.g., display layers 25). Signal path structure 26 may be formed from a flexible printed circuit bus, cables, wires, or other signal path structures.

Figure 3B:
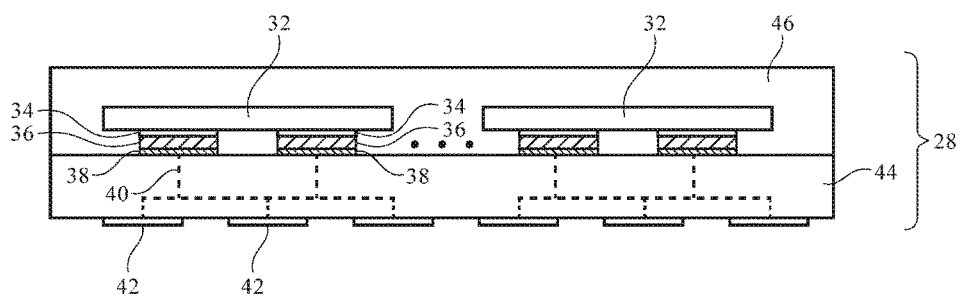
FIG. 3B is a cross-sectional side view of an illustrative packaged electrical device in accordance with an embodiment.

A cross-sectional side view of an illustrative packaged electrical device is shown in FIG. 3B. Packaged electrical device 28 may include integrated circuits, inductors, capacitors, resistors, and other discrete electronic components, microelectromechanical systems (MEMs) components, switches, connectors, sensors, and other electrical components 32. As shown in FIG. 3B, packaged device 28 may include a substrate such as substrate 44 (e.g., a printed circuit, a ceramic layer, a layer of glass, or other dielectric substrate layer). Substrate 44 may have metal traces for forming lower pads 42 and upper pads 38 and may have traces that form interconnects 40 (e.g., interconnects that couple pads 42 and/or pads 38).

One or more components 32 may be mounted to substrate 44. Components 32 (e.g., silicon integrated circuit die, etc.) may have component pads 34 that are coupled to substrate pads 38 using wire bonds, solder 36, or other conductive structures. Components 32 may be protected using an encapsulating material that covers components 32. The encapsulating material may be a polymer (e.g., a thermoset or thermoplastic polymer) or other dielectric. As an example, the encapsulating material may be molded plastic. The encapsulating material may include adhesive that flows under components 32 and molded plastic or other material to form a cap such as cap 46 that prevents environmental contaminants from interfering with the desired operation of components 32.

Figure 4:
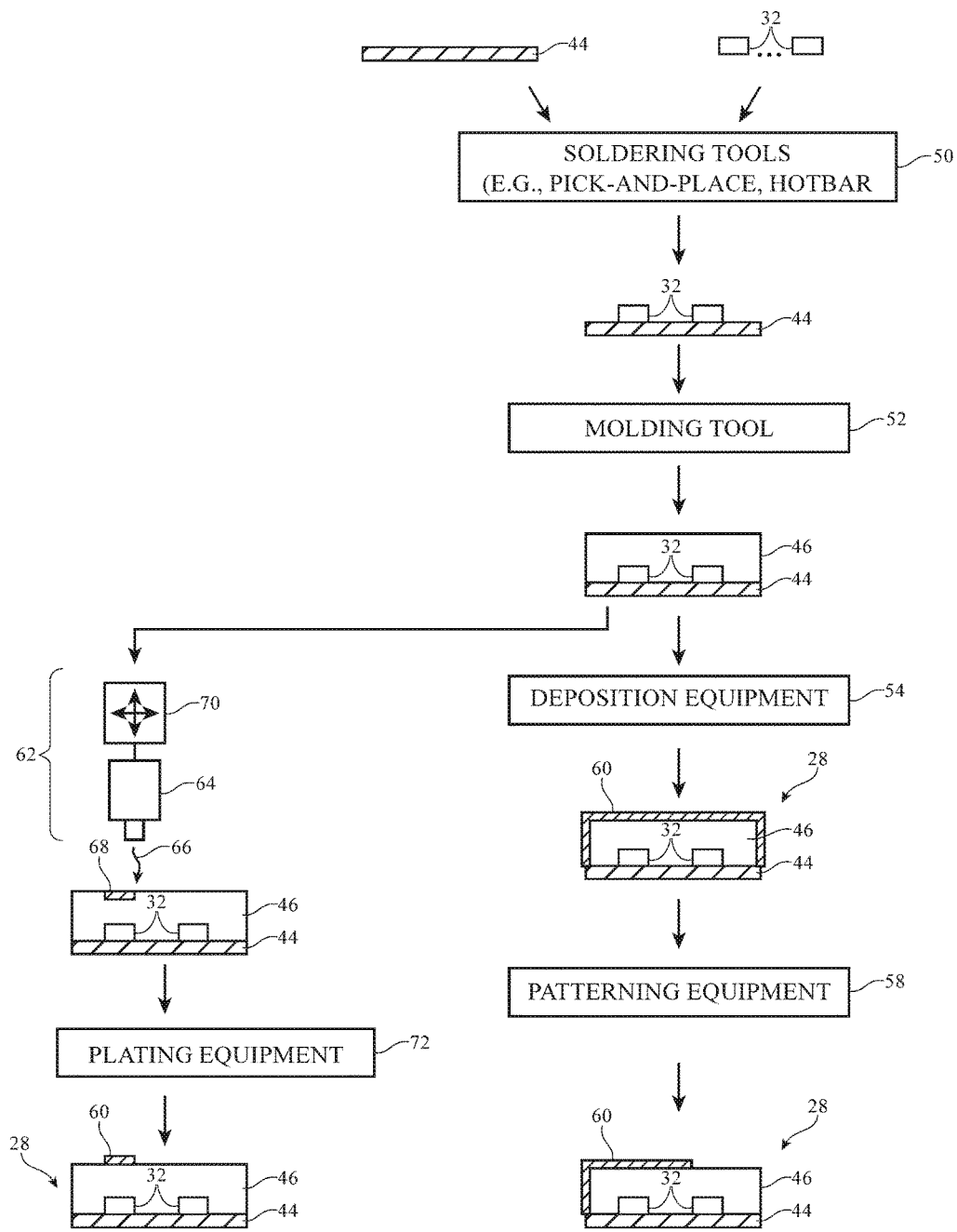
FIG. 4 is a diagram showing equipment and techniques of the type that may be involved in forming packages and devices in accordance with an embodiment.

FIG. 4 is a diagram showing illustrative equipment and techniques that may be used in forming packaged devices 28. As shown in FIG. 4, equipment 50 may be used in mounting components 32 on substrate 44. Equipment 50 may include pick-and-place equipment, hot-bar tools, reflow ovens, and other soldering equipment.

After components 32 have been mounted on substrate 44, cap formation equipment such as plastic molding tool 52 and other equipment may be used to encapsulate components 32 within cap 46. Cap 46 may be molded in a planar shape or a non-planar shape. If desired, metal structures may be insert molded within cap 46. Openings and other features may also be formed in cap 46 during the process of forming packaged device 28.

If desired, deposition equipment 54 may be used to deposit metal 60 (e.g., a blanket metal film, a metal coating that is patterned using a shadow mask during deposition, or other metal layer). Deposition equipment 54 may include physical vapor deposition equipment, chemical vapor deposition equipment, equipment for printing metal paint, etc.

Layer 60 may serve as an electromagnetic shield and/or may be used in forming signal paths and other metal structures (e.g., sensor structures, etc.). Patterning equipment 58 may be used to pattern metal 60 to form signal lines, regions of shielding, and other patterned metal structures. Patterning equipment 58 may include photolithographic equipment (e.g., equipment for depositing and patterning photoresist, etching equipment, etc.). Patterning equipment 58 may also include mechanical patterning tools, lasers, and other equipment for patterning metal 60.

If desired, metal 60 may be patterned using laser-based patterning and electroplating techniques. As shown in FIG. 4, for example, laser-based equipment 62 may be used to apply laser light 66 to desired areas such as area 68 on the surface of cap 46, thereby laser activating these areas. Equipment 62 may include lasers such as laser 64 for producing laser light 66 and may include computer-controlled positioners such as computer-controlled positioner 70 for controlling the position of laser 64. Cap 46 may be formed from a polymer or other material with additives that sensitize cap 46 to exposure to laser light 66. As a result, exposed areas 68 promote growth of patterned metal 60 during subsequent electroplating operations using electroplating equipment 72. Laser-based patterning techniques may be used for patterning metal 60 alone or in combination with using other patterned metal formation techniques (e.g., deposition through a shadow mask, deposition of a blanket film by deposition equipment 54 followed by patterning with patterning equipment 58, etc.).

Figure 5:
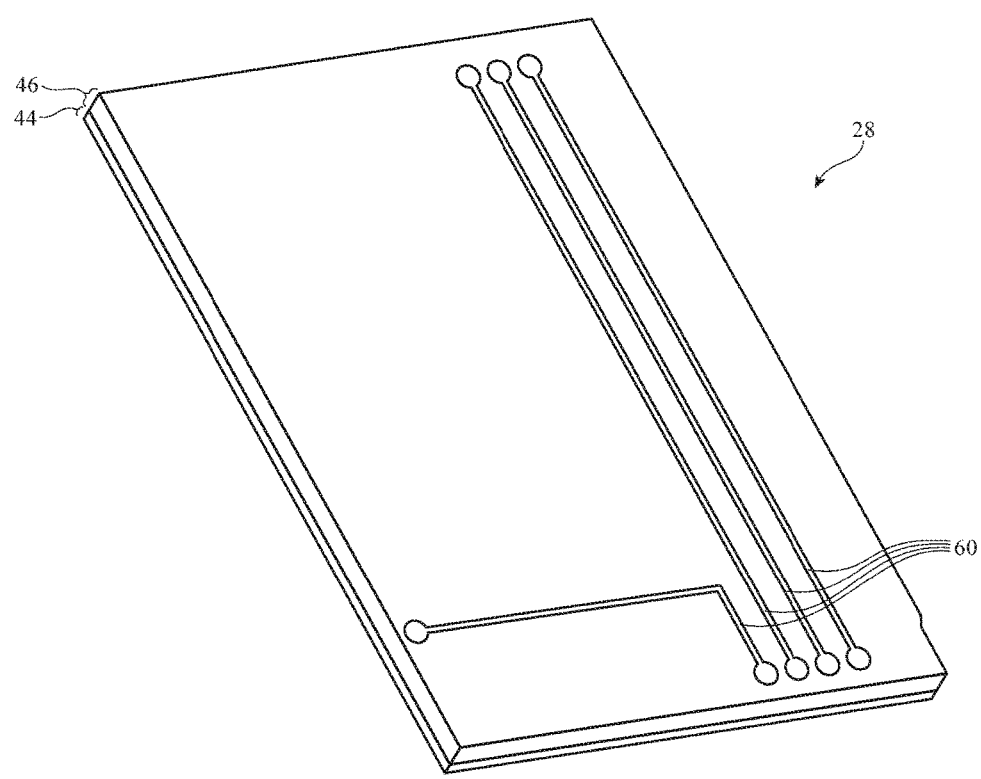
FIG. 5 is a perspective view of an illustrative packaged device with surface metal traces that can serve as signal busses and other signal paths for external components in accordance with an embodiment.

By patterning metal 60, signal paths may be formed on the surface of cap 46, as shown in the perspective view of illustrative packaged device 28 of FIG. 5. Signal paths formed from metal traces such as the metal traces of FIG. 5 may be used in forming signal busses (i.e., groups of signal paths that carry corresponding sets of signals), contacts (e.g., contact pads such as solder pads, contact pads for forming electrical connections with springs, etc.), shielding, and other metal structures. As shown in FIG. 5, the ends of the signal paths formed from the metal traces may be enlarged to form contact pads such as solder pads.

Figure 6:
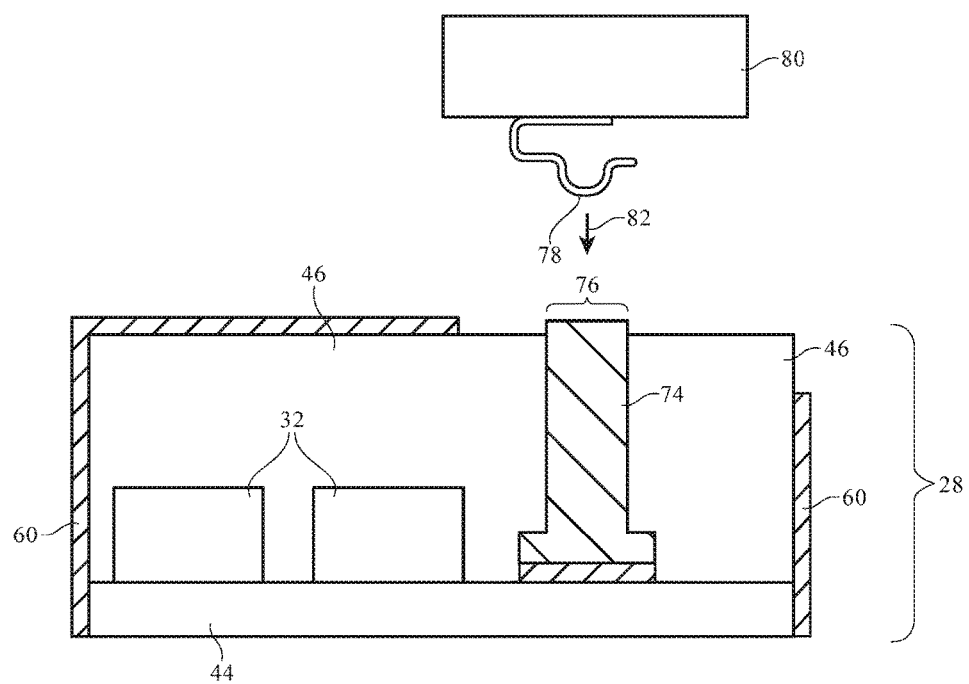
FIG. 6 is a cross-sectional side view of an illustrative package with a metal structure such as a metal post to which an electrical connection with an external component may be made in accordance with an embodiment.

If desired, metal structures may be incorporated in cap 46 (e.g., using insert molding techniques). A cross-sectional side view of packaged device 28 in an illustrative configuration in which device 28 includes an embedded metal structure is shown in FIG. 6. In the example of FIG. 6, metal post 74 has been soldered to a pad on the surface of substrate 44 adjacent to components 32 so that post 74 is electrically connected to interconnects in substrate 44 and thereby is electrically connected to circuitry in components 32. Cap 46 has been formed over components 32 so that post 74 passes through cap 46 and has protruding portion with exposed surface 76 to which electrical contact may be formed using spring 78 of component 80 when component 80 is moved in direction 82. Metal 60 may be patterned to form an opening that accommodates surface 76 of metal post 74. Metal 60 may, as an example, form a shield layer.

Figure 7:
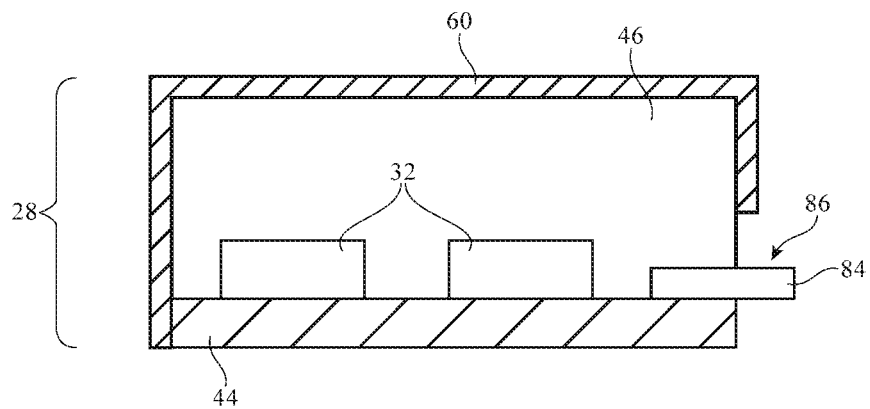
FIG. 7 is a cross-sectional side view of an illustrative packaged device with multiple components and a metal member mounted on a common package substrate in accordance with an embodiment.

FIG. 7 is a cross-sectional side view of an illustrative packaged device with a metal member. As shown in FIG. 7, packaged device 28 may include components 32 that are mounted to substrate 44. Metal members such as metal member 84 may be mounted to substrate 44 adjacent to components 32. Cap 46 may cover some of metal member 84. Some surfaces of member 84 such as surface 86 may protrude from cap 46 and may remain exposed to form contacts with external components (see, e.g., FIG. 6). Metal 60 may be patterned to form an opening to accommodate metal member 84 or may be shorted to metal member 84. Metal member 84 may be a metal block (e.g., a rectangular bar) or may have other suitable shapes. Components 32 and member 84 may be interconnected using interconnects in substrate 44.

Figure 8:
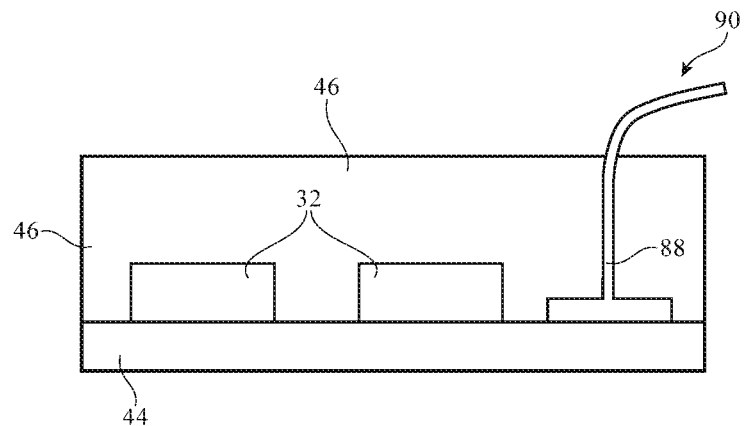
FIG. 8 is a cross-sectional side view of an illustrative packaged device with an insert-molded spring that protrudes from the device in accordance with an embodiment.

As shown in FIG. 8, metal structures such as structure 88 may be embedded within cap 46. Structure 88 may be a spring member that is partly embedded within cap 46 so that protruding spring portion 90 may form a spring contact. When configured so that spring 90 makes contact with an external component, structure 88 may form an electrical path that allows the external component to be coupled to circuitry in components 32 (via structure 88 and interconnects in substrate 44).

Figure 9:
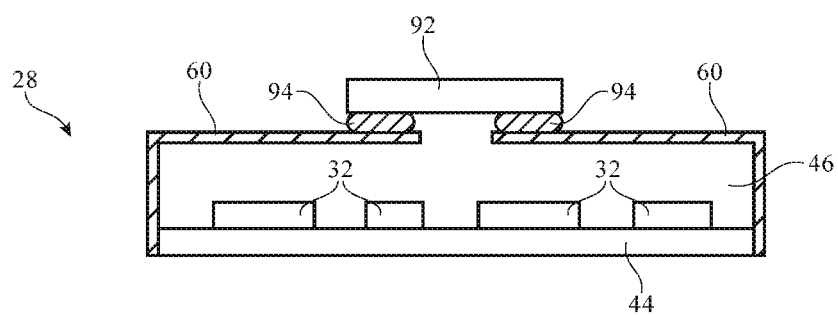
FIG. 9 is a cross-sectional side view of an illustrative packaged device with surface metal traces that serve as signal paths to which one or more external components may be mounted using solder joints or other coupling mechanisms in accordance with an embodiment.

FIG. 9 is a cross-sectional side view of an illustrative packaged device with surface metal traces that serve as signal paths. As shown in FIG. 9, external components such as component 92 (e.g., a component such as a packaged integrated circuit or other component such as one of devices 28) may be coupled to metal traces formed from metal 60. Solder 94 or other conductive material may be used to mount external component 92 to signal paths formed from metal 60. Portions of metal 60 may also be used in forming shielding.

Figure 10:
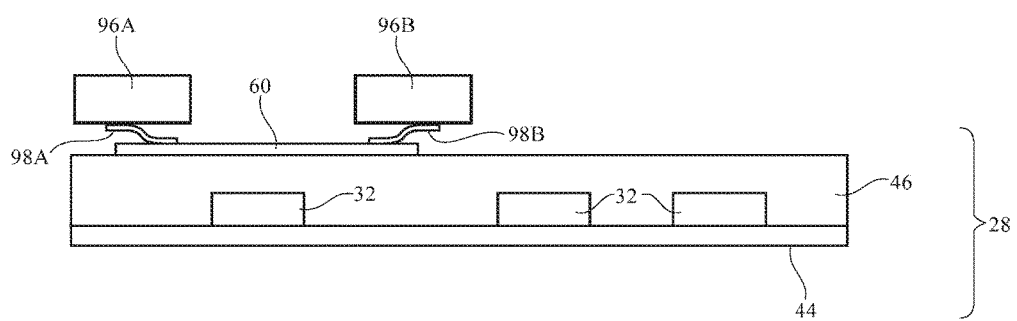
FIG. 10 is a cross-sectional side view of an illustrative packaged device showing how multiple external components may be coupled to metal traces on the surface of the device using connections based on springs in accordance with an embodiment.

FIG. 10 is a cross-sectional side view of an illustrative packaged device showing how multiple external components may be coupled to metal traces on the surface of the device using connections based on springs. As shown in FIG. 10, metal 60 on the surface of cap 46 may serve as a signal path that couples spring 98A of component 96A to spring 98B of component 96B, thereby electrically connecting components 96A and 96B.

Figure 11:
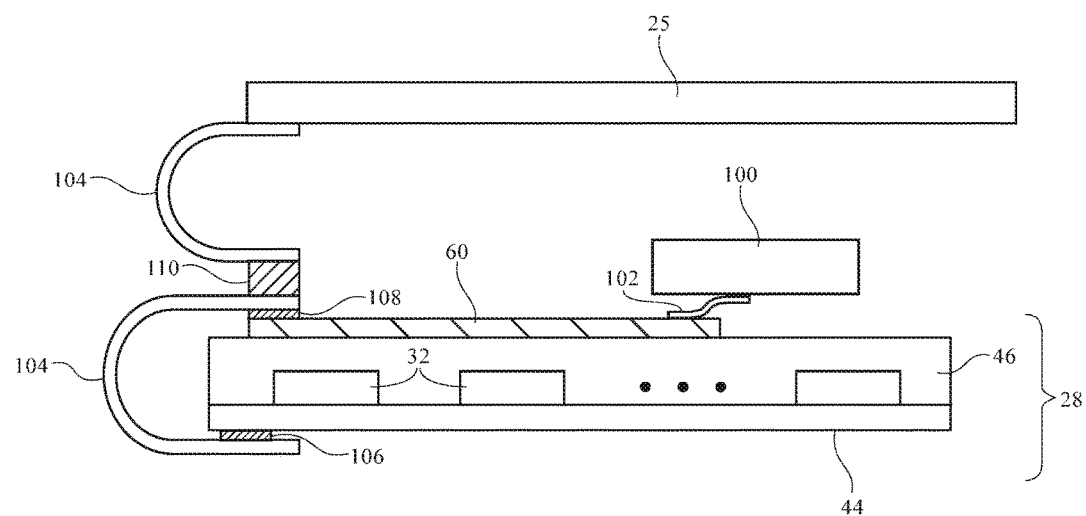
FIG. 11 is a cross-sectional side view of an illustrative packaged device having surface metal traces for forming interconnect paths for external components in accordance with an embodiment.

FIG. 11 is a cross-sectional side view of an illustrative packaged device having surface metal traces for forming interconnect paths for external components. In the example of FIG. 11, packaged device 28 has components 32 mounted to substrate 44 and covered with cap 46. One or more flexible printed circuits 104 may be coupled to pads 106 on the underside of substrate 44. One or more flexible printed circuits 104 (e.g., flexible printed circuits that are entirely flexible or flexible printed circuits of the type sometimes referred to as "rigid flex" that contain flexible printed circuit tails extending from rigid printed circuit board areas) may also be coupled to metal traces 60 on the upper surface of cap 46 (e.g., using solder 108). Connectors such as connectors 110 may be used to couple flexible printed circuits 104 together (as an example). Flexible printed circuits 104 may also be coupled to components such as display module 25. External components such as electrical component 100 (e.g., a packaged device such as one of devices 28) may be coupled to metal 60 using solder, springs such as spring 102, or other conductive structures.

Figure 12:
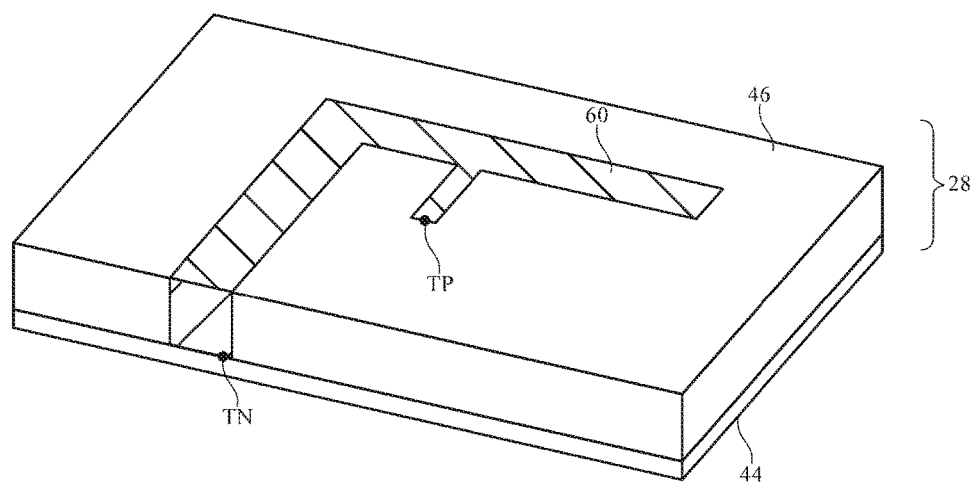
FIG. 12 is a perspective view of an illustrative packaged device having surface metal traces that form an antenna such as an inverted-F antenna in accordance with an embodiment.

If desired, metal 60 may be patterned to form antenna structures. As shown in the perspective view of illustrative packaged device 28 of FIG. 12, metal 60 may be patterned to an antenna such as an inverted-F antenna (e.g., an inverted-F antenna having a feed formed from positive feed terminal TP and ground antenna feed terminal TN). Metal 60 may be used to from a loop antenna, a slot antenna, a planar inverted-F antenna, a patch antenna, a monopole antenna, a dipole, near-field communications antennas, or other suitable antennas.

Figure 13:
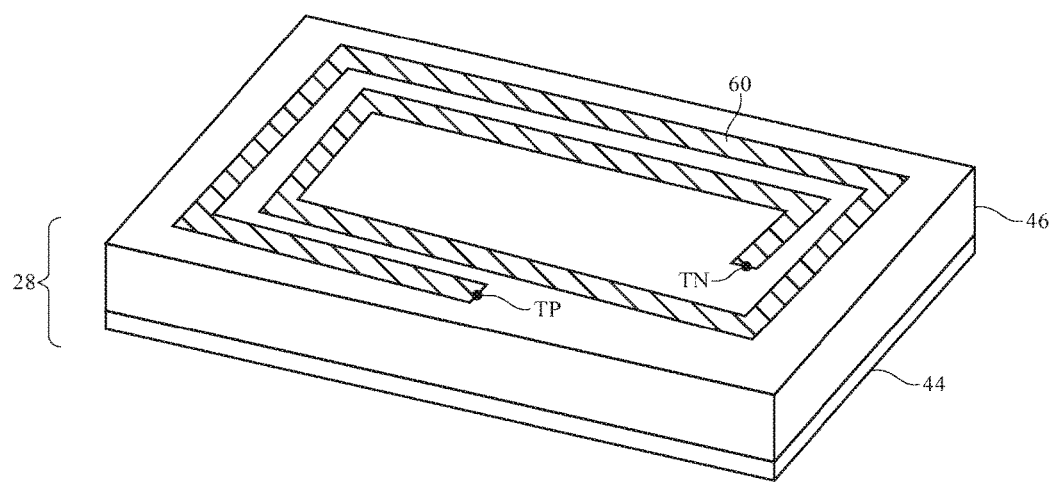
FIG. 13 is a perspective view of an illustrative packaged device having surface metal traces that form a multi-turn near-field communications loop antenna in accordance with an embodiment.

FIG. 13 is a perspective view of an illustrative configuration for packaged device 28 in which metal 60 has been patterned to form a loop antenna for supporting near-field communications (NFC) at a frequency of 13.56 MHz or other suitable communications frequency. The antenna of FIG. 13 is a loop antenna that includes multiple turns of metal traces forming an inductor. During operation, the antenna of FIG. 13 may be coupled to another NFC antenna through near-field electromagnetic coupling. The antenna of FIG. 13 may be fed using antenna feed terminals such as feed terminals TP and TN.

Figure 14:
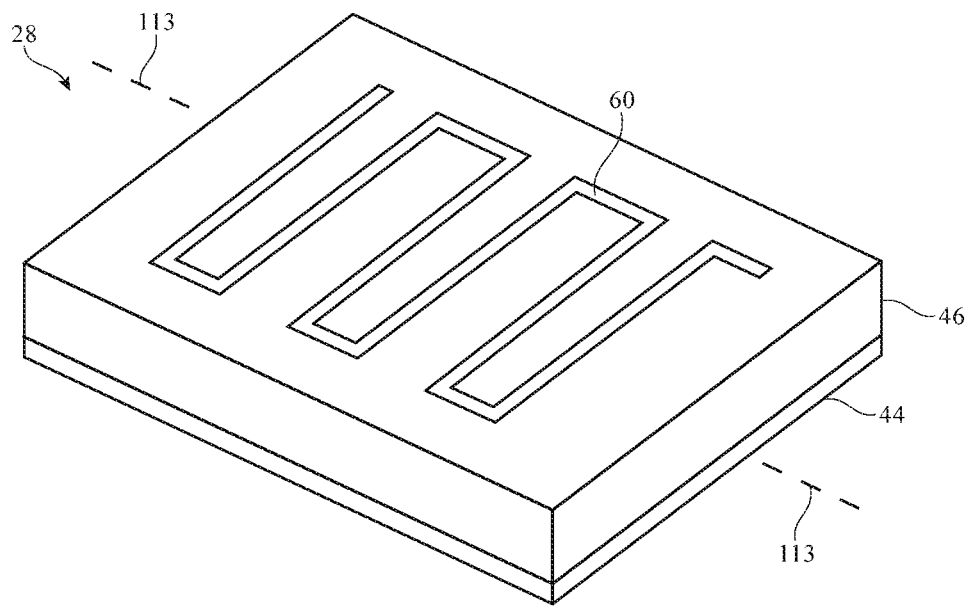
FIG. 14 is a perspective view of an illustrative packaged device having a meandering surface metal trace for forming a strain gauge sensor in accordance with an embodiment.
Figure 15:
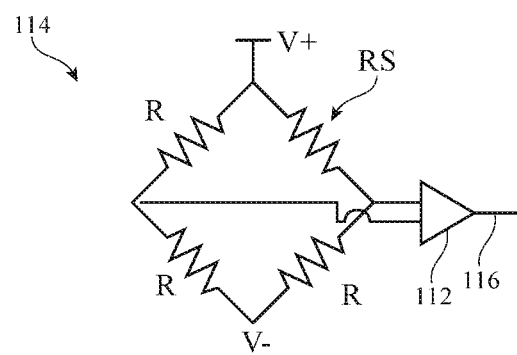
FIG. 15 is a circuit diagram of an illustrative strain gauge bridge circuit in accordance with an embodiment.

FIG. 14 is a perspective view of packaged device 28 in an illustrative configuration in which metal 60 has been patterned to form a meandering surface trace that may serve as a variable resistor in a strain gauge (strain sensor). The variable resistor formed from patterned metal 60 may have a resistance that increases when device 28 is bent about axis 113, thereby stretching and thinning metal 60. The resistor of FIG. 14 may be placed in a bridge circuit such as Wheatstone bridge circuit 114 of FIG. 15. In this type of circuit, resistor RS (and/or other resistors) may be formed from a variable resistor structure of the type shown by metal resistor 60 of FIG. 14 and the other resistors R of the bridge may be formed from structures that do not deform with device 28 and that therefore serve as reference resistors. Bridge circuits with two variable resistors RS and two reference resistors R may also be used. Power may be applied to bridge circuit 114 using positive power supply terminal V+ and ground power supply terminal V−. Amplifier 112 may supply an output signal on output line 116 that is proportional to the amount of strain experienced by strain gauge resistor RS (see, e.g., the resistor formed from the serpentine metal path of metal 60 on the surface of cap 46 in device 28 of FIG. 14). The strain sensor formed from metal 60 may be used to make strain measurements for device 28 (e.g., to determine whether device 28 is being subjected to excess stress, to allow device 28 to serve as a button or other input device, etc.).

Figure 16:
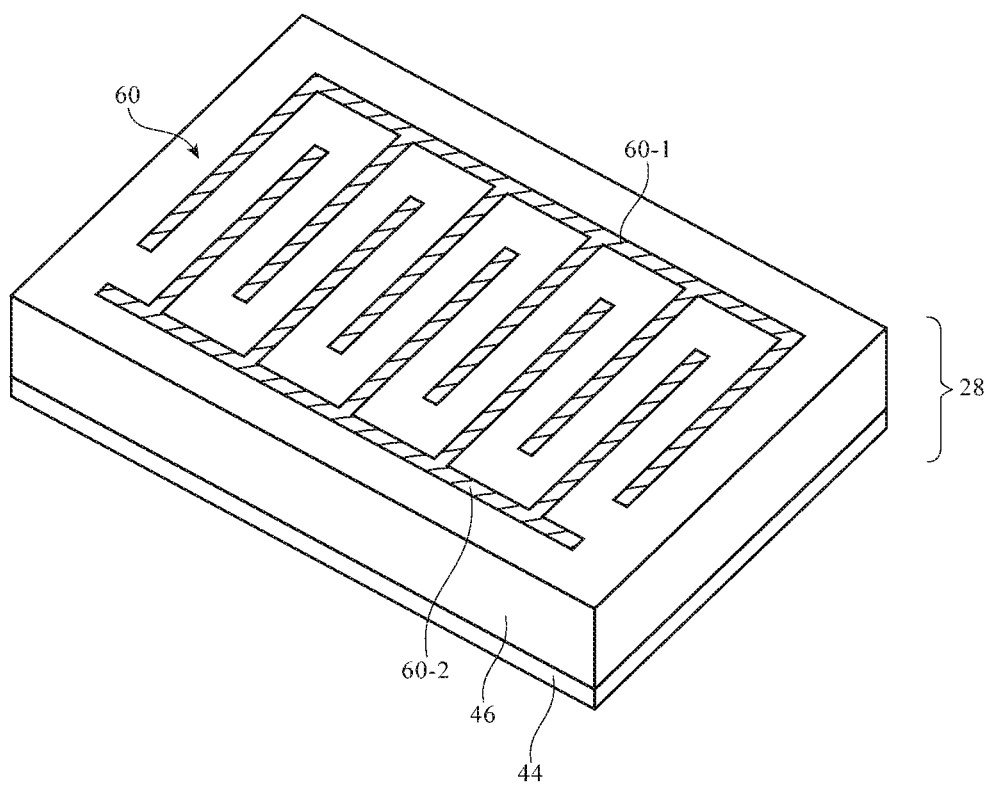
FIG. 16 is a perspective view of an illustrative packaged device having electrodes with interleaved fingers for forming a moisture sensor in accordance with an embodiment.

If desired, a moisture sensor may be formed by patterning metal 60 on the surface of cap 46 of packaged device 28, as shown in FIG. 16. In the example of FIG. 16, metal 60 has been patterned to form two moisture sensor electrodes. Electrodes 60-1 and 60-2 have interdigitated sets of fingers that are separated by gaps. When moisture is present, some of the gaps will be bridged by moisture and a corresponding change in resistance and/or capacitance between the electrodes can be measured by device 10. By patterning metal 60 to form a moisture sensor of the type shown in FIG. 16, device 10 can monitor for undesired moisture intrusion into housing 12. Moisture detection circuitry may be formed from components 32 within a packaged device having an external moisture sensor or from other circuitry in device 10.

Figure 17:
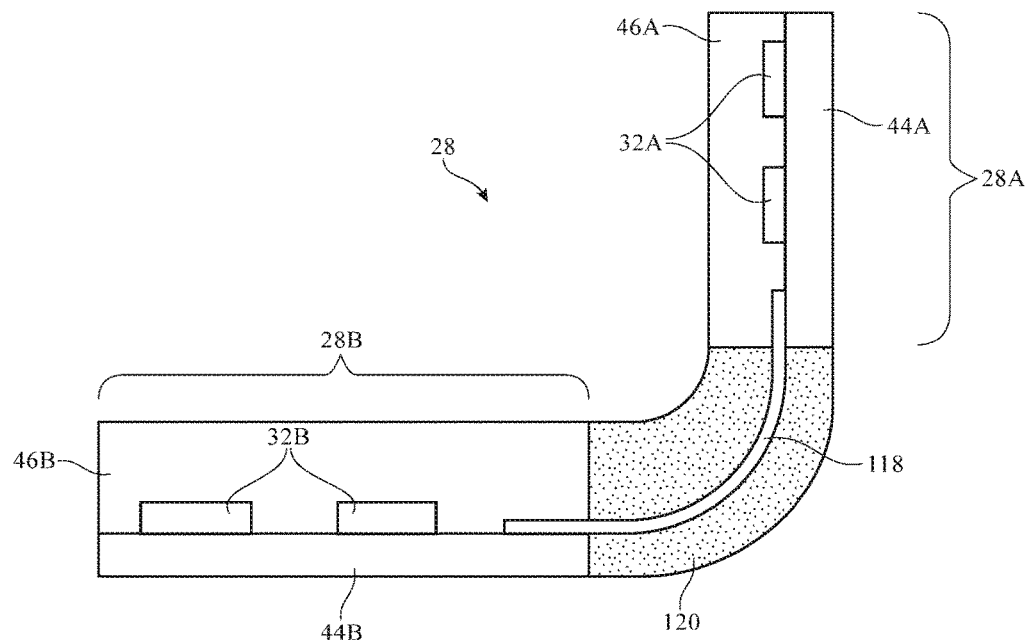
FIG. 17 is a cross-sectional side view of a packaged device having two package substrates joined by a flexible printed circuit that is embedded within an elastomeric layer in accordance with an embodiment.

FIG. 17 is a cross-sectional side view of packaged device 28 in an illustrative configuration in which device 28 has two packaged device portions. Portion 28A has substrate 44A, components 32A on substrate 44A, and cap 46A that covers components 32A. Portion 28B has substrate 44B, components 32B on substrate 44B, and cap 46B that covers components 32B. Flexible printed circuit 118 may have one end mounted to substrate 44A and an opposing end mounted to substrate 44B (e.g., using solder). Flexible printed circuit 118 may couple interconnects within respective substrates 44A and 44B together, thereby coupling the circuitry of components 32A and 32B.

Figure 18:
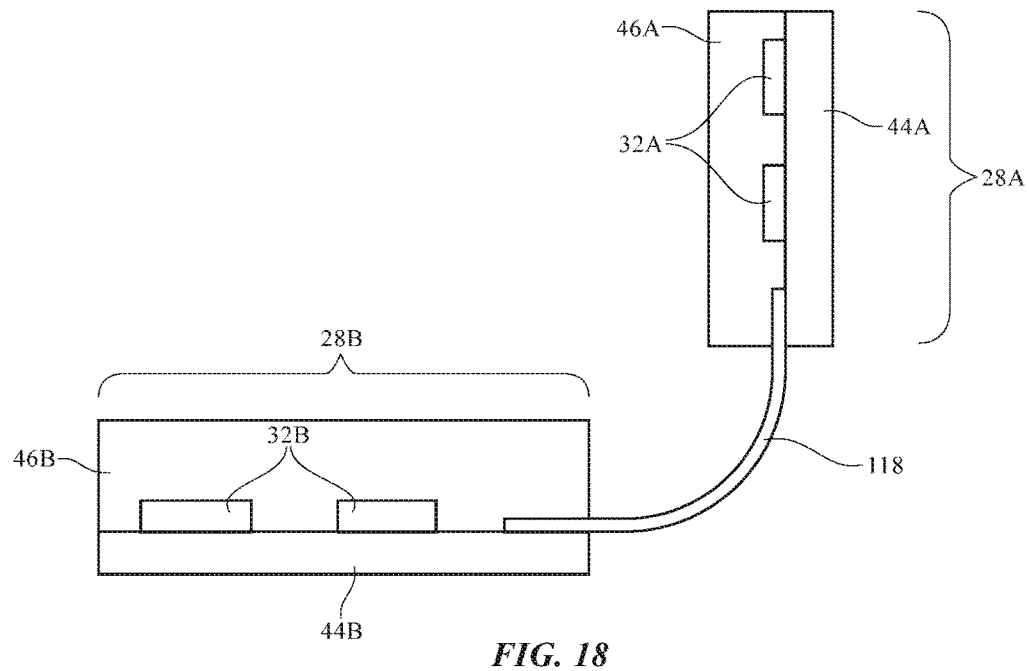
FIG. 18 is a cross-sectional side view of a packaged device having two package substrates joined by a flexible printed circuit that has not been embedded within a package material in accordance with an embodiment.

Flexible printed circuit 118 may be used to accommodate a bend in device 28. This may allow device 28 to be mounted in a confined interior space within housing 12. The bend may be a right angle bend or other bend (i.e., a non-right-angle bend) that allows substrates 44A and 44B to lie in planes that are not parallel to each other (i.e., the surface normal for the plane of portion 28A may lie perpendicular to the surface normal for the plane of portion 28B or may otherwise not be parallel to the surface normal for the plane of portion 28B). A flexible polymer or other elastomeric material such as material 120 may cover flexible printed circuit 118 and may help protect flexible printed circuit 118 from exposure to moisture (as shown in FIG. 17) or elastomeric material 120 may be omitted (as shown in FIG. 18).

Figure 19:
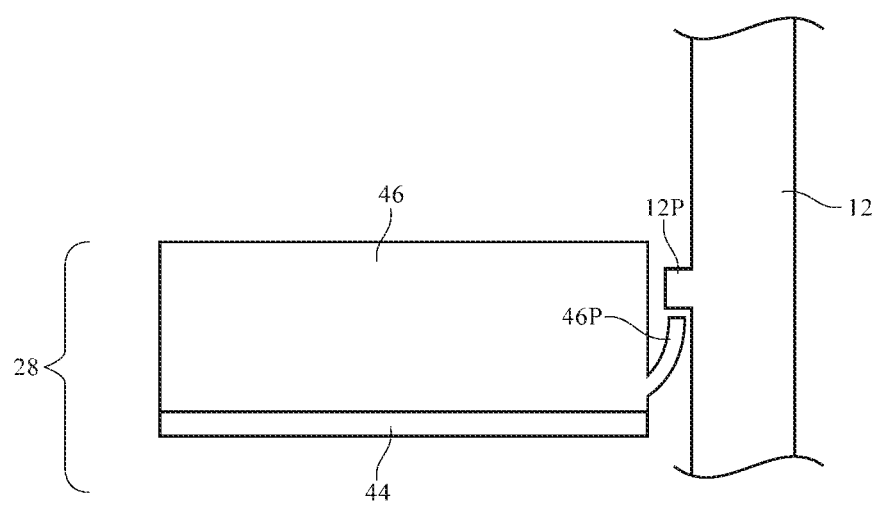
FIG. 19 is a cross-sectional side view of an illustrative packaged device having an engagement feature such as a snap that engages a mating engagement feature in a housing structure of an electronic device in accordance with an embodiment.

As shown in FIG. 19, cap 46 may be provided with an engagement feature that helps mount device 28 within housing 12. In the example of FIG. 19, cap 46 has been provided with protrusion 46P. Protrusion 46P may have the shape of a flexible snap structure that engages with a mating engagement feature in device 10 such as protrusion 12P of housing 12. Cap 46 may be provided with multiple protrusions 46P (e.g., multiple snaps) or other engagement features. The arrangement of FIG. 19 is merely illustrative.

Figure 20:
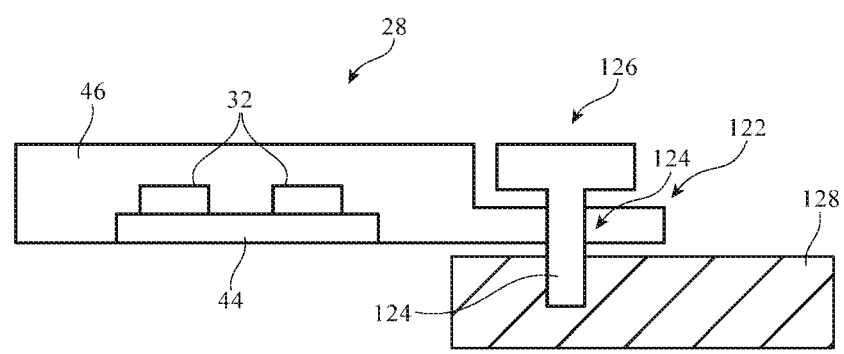
FIG. 20 is a cross-sectional side view of an illustrative packaged device having a locally thinned portion to accommodate a screw in accordance with an embodiment.

FIG. 20 is a cross-sectional side view of packaged device 28 in an illustrative configuration in which device 28 has a locally thinned portion to accommodate a screw. As shown in FIG. 20, components 32 may be mounted on substrate 44 and covered with cap 46. Cap 46 may have thinned portion 122 to accommodate the head of screw 126. Portion 122 of cap 46 may have an opening such as opening 124 to allow the shaft of screw 126 (or other suitable threaded fastener) to pass though cap 46. Screws such as screw 126 may be used to attach device 28 to structures such as structure 128 (e.g., a portion of housing 12, an internal support structure in device 10, etc.).

Figure 21:
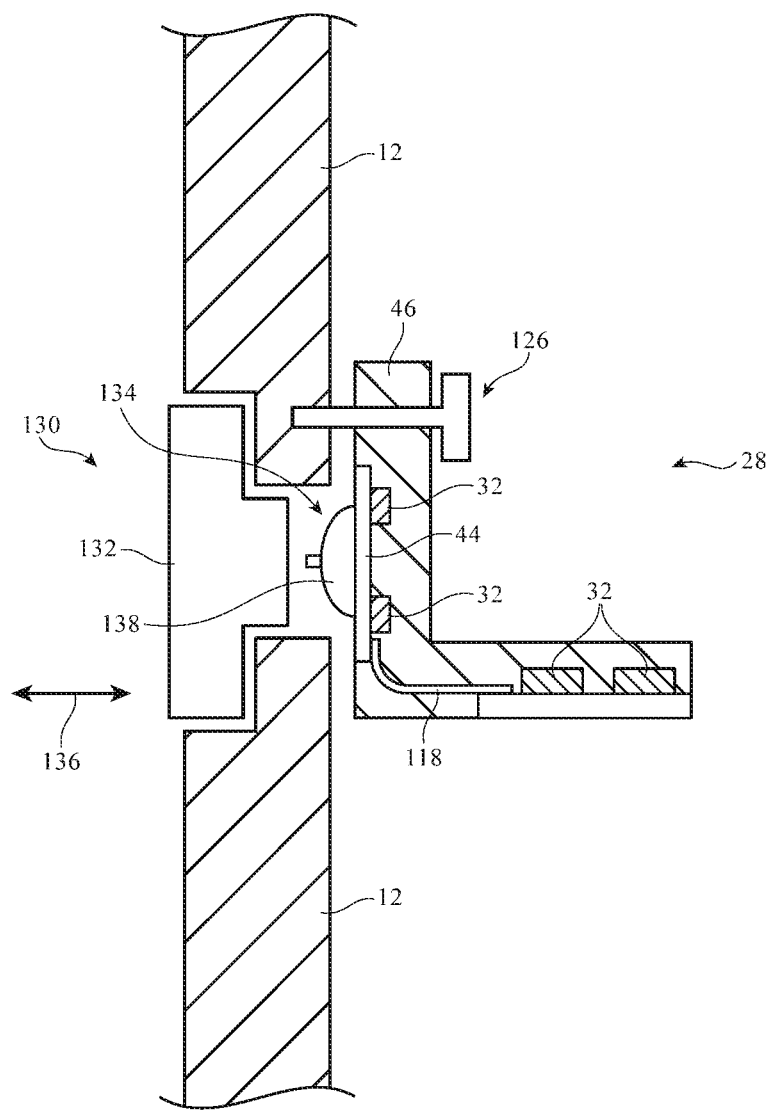
FIG. 21 is a cross-sectional side view of an illustrative L-shaped packaged device with an integral component such as a dome switch for forming a button in an electronic device in accordance with an embodiment.
Figure 22:
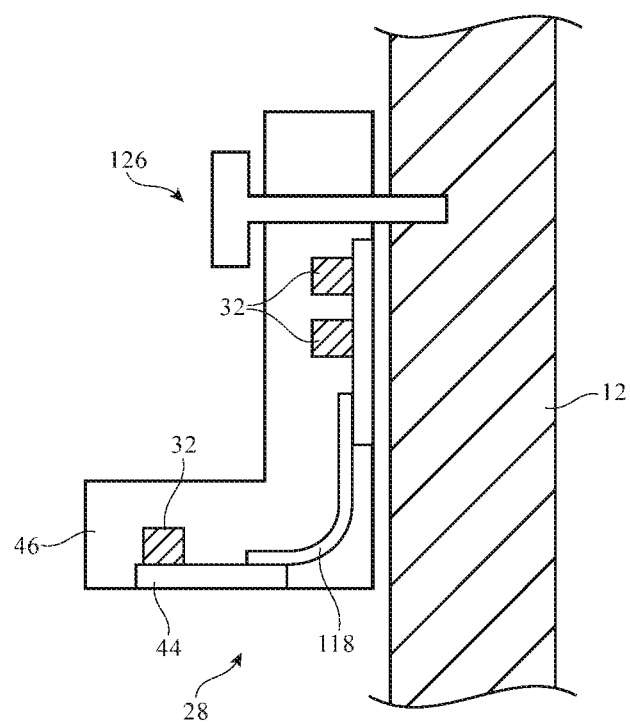
FIG. 22 is a cross-sectional side view of an illustrative L-shaped packaged device containing a pair of package substrates that have been populated with electronic components and joined by a flexible printed circuit that is embedded within the packaged device in accordance with an embodiment.

FIG. 21 is a cross-sectional side view of device 28 in an illustrative configuration in which cap 46 of device 28 is L-shaped. Device 28 may be an L-shaped packaged device or other device with an integral component such as dome switch 138. This may allow device 28 to form a switch module for a button such as button 130. In the example of FIG. 21, button 130 has movable button member 132. During operation, button member 132 moves in directions 136. When pressed, button member 132 contacts dome switch 138 and actuates switch 138. Switch 138 may be mounted to one of substrates 44. Components 32 may be mounted to an opposing side of the substrate. L-shaped cap 46 may cover components 32 and substrates 44. Cap 46 may have an opening to accommodate screw 126. Screw 126 may be used to mount device 28 to housing 12. Flexible printed circuit 118 may be embedded within cap 46 and may be used to couple substrates 44 together. In the example of FIG. 22, device 28 has an L-shaped cap 46 with an opening to accommodate screw 126 while screw 126 attaches device 28 to housing 12 and does not include a dome switch.

Figure 23:
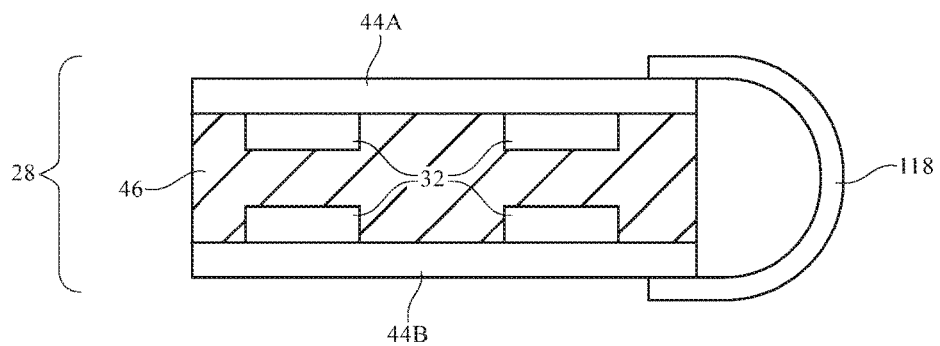
FIG. 23 is a cross-sectional side view of an illustrative packaged device having stacked package substrates joined by an external flexible printed circuit in accordance with an embodiment.
Figure 24:
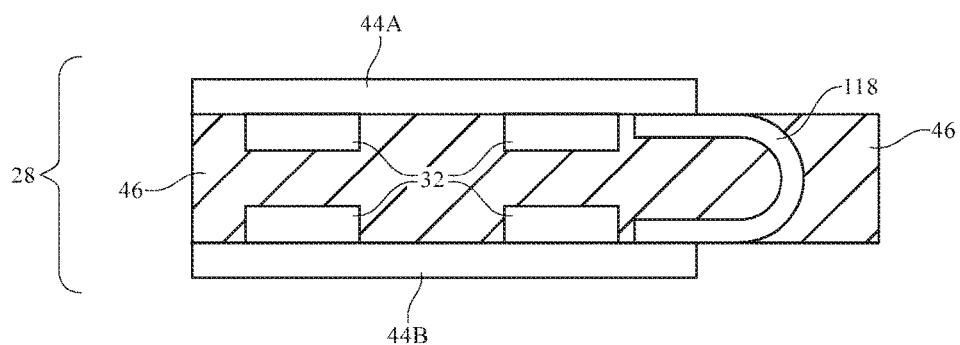
FIG. 24 is a cross-sectional side view of an illustrative packaged device having stacked package substrates joined by an internal flexible printed circuit in accordance with an embodiment.

If desired, multiple substrates in device 28 may be stacked on top of each other. For example, substrates 44A and 44B of packaged device 28 of FIG. 23 may be stacked on top of each other. Components 32 may be mounted on the sides of the substrates that face each other. Cap 46 may cover components 32 and substrates 44A and 44B. Flexible printed circuit 118 may be coupled to the outer surfaces of substrates 44A and 44B as shown in FIG. 23, or may be coupled to the inner surfaces of substrates 44A and 44B as shown in the example of FIG. 24. Flexible printed circuit 118 of FIG. 24 may be embedded within cap 46.

Figure 25:
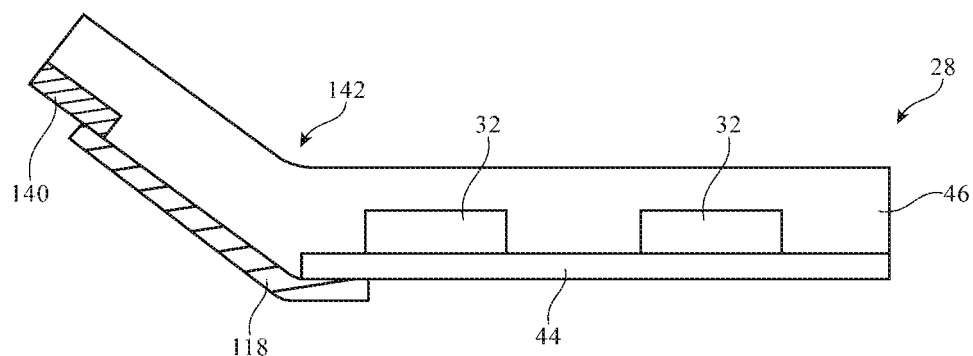
FIG. 25 is a cross-sectional side view of an illustrative packaged device with a bent portion and a flexible printed circuit that couples a component on an end of the device to a substrate within the device in accordance with an embodiment.
Figure 26:
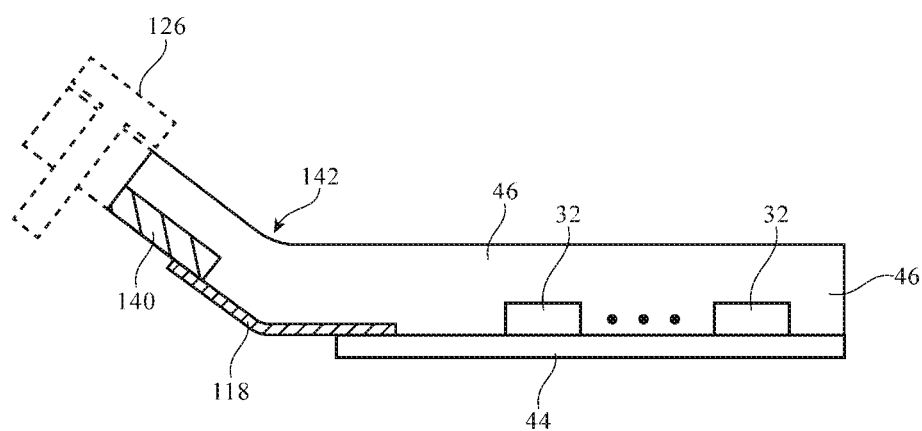
FIG. 26 is a cross-sectional side view of an illustrative packaged device that has a bent portion and a flexible printed circuit that couples a component on an end of the device to a substrate within the device and that has a portion to accommodate a fastener such as a screw in accordance with an embodiment.

In L-shaped package configurations for device 28, cap 46 may have a right angle bend. If desired, cap 46 may have non-right-angle bends (e.g., bends at angles of 0-90°, 10-80°, 30-60°, etc.). This type of arrangement is shown in FIGS. 25 and 26. In the examples of FIGS. 25 and 26, cap 46 has bend 142. Flexible printed circuit 118 may be coupled between substrate 44 and component 140, so that the circuitry of components 32 may be interconnected with component 140. Component 140 may be an electrical component such as a microphone, sensor, or other input-output device (as an example). Flexible printed circuit 118 may be coupled to the upper or lower surface of substrate 44 and may be coupled to the upper or lower surface of components 140.

Cap 46 may cover components 32 while flexible printed circuit 118 is uncovered by cap 46 as shown in FIG. 25 or cap 46 may cover both components 32 and a portion of flexible printed circuit 118 as shown in FIG. 26. As shown in FIG. 26, portions of cap 46 may be provided with openings to accommodate screws such as illustrative screw 126 of FIG. 26, thereby facilitating the mounting of device 28 to housing 12 or other support structures.

Figure 27:
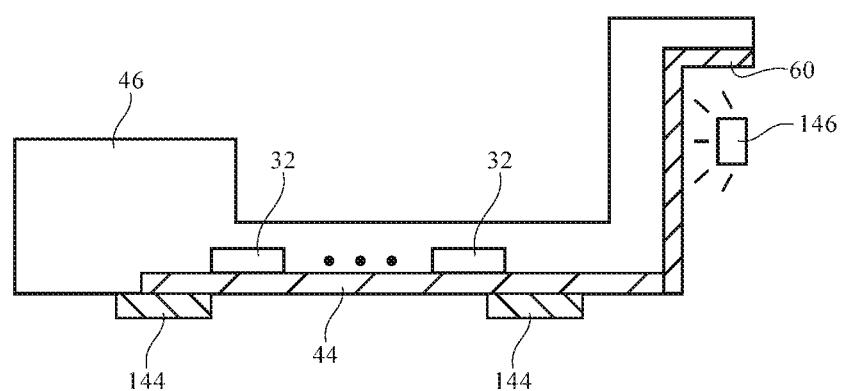
FIG. 27 is a cross-sectional side view of an illustrative packaged device having a portion that forms an electromagnetic shield in accordance with an embodiment.

FIG. 27 is a cross-sectional side view of packaged device 28 in an illustrative configuration in which device 28 has a portion that forms an electromagnetic shield. As shown in FIG. 27, components 32 may be mounted on substrate 44. Cap 46 may cover components 32 and substrate 44. Metal 60 may be formed on one or more surfaces of cap 46 at a location between external electrical component 146 and components 32. In this position, metal 60 may serve as an electromagnetic shield that reduces interference between component 146 and components 32. If desired, device 28 may be provided with support structures such as feet 144. Feet 144 may be formed from a sticky material (e.g., an elastomeric substance such as a soft polymer) to help secure device 28 to a support structure.

Figure 28:
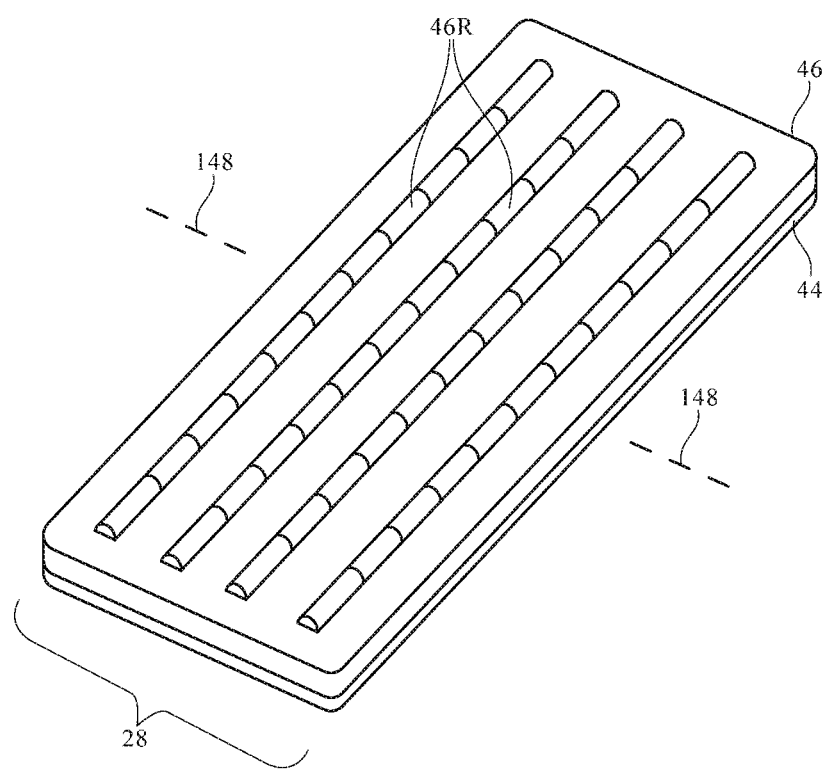
FIG. 28 is a cross-sectional side view of an illustrative packaged device having integral strengthening features such as a set of parallel ridges that prevent bending of the packaged device in accordance with an embodiment.

FIG. 28 is a cross-sectional side view of device 28 in an illustrative configuration in which device 28 has strengthening features. Strengthening features for device 28 may be formed as integral molded structures in cap 46. In the example of FIG. 28, device 28 has parallel ridges 46R that help prevent undesired flexing of device 28 about axis 148. Strengthening features may be provided in the form of ridges or other protrusions and may be provided on one or more sides of cap 46. The configuration of FIG. 28 in which strengthening ribs 46R have been formed on the upper surface of cap 46 is merely illustrative.

The features of the illustrative packaged devices 28 of FIGS. 3A, 3B, and 4-28 may be used alone or in combination with any other features of devices 28 of FIGS. 3A, 3B, and 4-28. For example, device 28 may have any or all of the features of the structural features of FIGS. 3A, 3B, and 4-28, any or all of the electrical features of FIGS. 3A, 3B, and 4-28, and/or any other features from FIGS. 3A, 3B, and 4-28. The examples of FIGS. 3A, 3B, and 4-28 and the other drawings are merely illustrative.

The foregoing is merely illustrative and various modifications can be made by those skilled in the art without departing from the scope and spirit of the described embodiments. The foregoing embodiments may be implemented individually or in any combination.

What is claimed is:
1. A packaged electrical device, comprising:
a substrate;
electrical components mounted to the substrate;

a single, molded cap that covers the electrical components and that has a first exterior surface and a second exterior surface, wherein the second exterior surface extends from the first exterior surface at a nonzero angle and wherein the molded cap directly contacts the electrical components; and signal lines formed from metal traces on the first and second exterior surfaces of the molded cap.

2. The packaged electrical device defined in claim 1 wherein the signal lines include parallel metal traces that form a signal bus.

3. The packaged electrical device defined in claim 2 wherein the signal lines include contact pads and wherein the electrical components include silicon integrated circuit die.

4. The packaged electrical device defined in claim 3 wherein the signal lines comprise electroplated signal lines.

5. The packaged electrical device defined in claim 4 wherein the molded cap comprises laser activated areas under the electroplated signal lines.

6. The packaged electrical device defined in claim 5 wherein the signal lines are electrically isolated from the electrical components.

7. The packaged electrical device defined in claim 3 wherein the molded cap comprises molded plastic, the packaged electrical device further comprising a metal structure embedded within the molded cap.

8. The packaged electrical device defined in claim 7 wherein the metal structure has a first portion that is mounted to the substrate and has a second portion that protrudes from the molded cap.

9. The packaged electrical device defined in claim 8 further comprising a shield layer on the surface of the molded cap, wherein the shield layer has an opening through which the second portion passes.

10. A packaged electrical device, comprising:
a printed circuit substrate;
integrated circuits mounted to the substrate;
molded plastic that overlaps the integrated circuits and that has first and second exterior surfaces, wherein the second exterior surface extends from the first exterior surface at a nonzero angle and the molded plastic directly contacts the printed circuit substrate and the integrated circuits; and
a patterned metal layer on the first and second exterior surfaces.

11. The packaged electrical device defined in claim 10 wherein the patterned metal layer is configured to form an antenna.

12. The packaged electrical device defined in claim 10 wherein the patterned metal layer is configured to form a strain gauge resistor.

13. The packaged electrical device defined in claim 12 wherein the patterned metal layer is configured to moisture sensor electrodes.

14. The packaged electrical device defined in claim 10 further comprising a spring contact that protrudes from the molded plastic.

15. The packaged electrical device defined in claim 10 wherein the molded plastic has a bend.

16. The packaged electrical device defined in claim 15 further comprising:
a flexible printed circuit; and
an electrical component that is not mounted on the printed circuit substrate, wherein the flexible printed circuit is coupled between the printed circuit substrate and the electrical component.

17. A packaged electrical device, comprising:
a substrate;
electrical components mounted to the substrate;
a cap that covers the electrical components and that has a first exterior surface and a second exterior surface that extends perpendicularly from the first exterior surface;
signal lines formed from metal traces on the first and second exterior surfaces of the cap; and
a unitary metal structure embedded within the cap, wherein the metal structure has a first portion that is mounted to the substrate and a second portion that protrudes from the cap.

18. The packaged electrical device defined in claim 17 wherein the cap further comprises a third exterior surface that extends perpendicularly from the first exterior surface.

19. The packaged device defined in claim 18 wherein the signal lines are formed from metal traces on the first, second, and third exterior surfaces of the cap.

20. The packaged device defined in claim 19 wherein the third exterior surface is parallel to the second exterior surface.

21. The packaged device defined in claim 17 wherein the entire metal structure is completely surrounded by the cap except at the first and second portions.

* * * * *